(12) United States Patent
Reinmuth (10) Patent No.: US 11,976,995 B2
(45) Date of Patent: May 7, 2024

(54) MICROMECHANICAL COMPONENT FOR A CAPACITIVE SENSOR OR SWITCH DEVICE

(71) Applicant: Robert Bosch GmbH, Stuttgart (DE)

(72) Inventor: Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 217 days.

(21) Appl. No.: 17/439,231

(22) PCT Filed: Mar. 25, 2020

(86) PCT No.: PCT/EP2020/058281
§ 371 (c)(1),
(2) Date: Sep. 14, 2021

(87) PCT Pub. No.: WO2020/207798
PCT Pub. Date: Oct. 15, 2020

(65) Prior Publication Data
US 2022/0155168 A1    May 19, 2022

(30) Foreign Application Priority Data
Apr. 12, 2019  (DE) .......................... 102019205348.3

(51) Int. Cl.
*G01L 9/00*    (2006.01)
*B81B 3/00*    (2006.01)
(52) U.S. Cl.
CPC .......... *G01L 9/0072* (2013.01); *B81B 3/0021* (2013.01); *B81B 2201/0264* (2013.01); *B81B 2203/0127* (2013.01)

(58) Field of Classification Search
None
See application file for complete search history.

(56) References Cited

U.S. PATENT DOCUMENTS

| | | | |
|---|---|---|---|
| 2014/0060169 A1* | 3/2014 | McNeil | G01L 9/12 73/718 |
| 2014/0137670 A1* | 5/2014 | Hata | G01L 1/148 73/862.621 |

(Continued)

OTHER PUBLICATIONS

International Search Report for PCT/EP2020/058281, dated Jul. 7, 2020.

*Primary Examiner* — Brandi N Hopkins
*Assistant Examiner* — Nigel H Plumb
(74) *Attorney, Agent, or Firm* — NORTON ROSE FULBRIGHT US LLP; Gerard A. Messina (57) ABSTRACT

A micromechanical component for a capacitive sensor or switch device, having a substrate having a substrate surface, a diaphragm mounted on the substrate surface having a self-supporting region, at least one lever element and at least one first electrode connected to the at least one lever element. The at least one lever element is connected to the diaphragm in such a way that when there is a warping of the self-supporting region of the diaphragm the at least one lever element is set into a rotational movement, whereby the at least one connected first electrode is set into a first adjustment movement oriented at an angle to the substrate surface. The at least one lever element and the at least one first electrode connected to the at least one lever element are situated between the substrate surface and the diaphragm inner side of the self-supporting region of the diaphragm.

16 Claims, 8 Drawing Sheets

(56) References Cited

U.S. PATENT DOCUMENTS

2017/0108391 A1* 4/2017 Ikehashi .................. G01L 9/12
2018/0335358 A1* 11/2018 Zheng .................. B81B 7/0064

* cited by examiner

MICROMECHANICAL COMPONENT FOR A CAPACITIVE SENSOR OR SWITCH DEVICE

FIELD

The present invention relates to a micromechanical component for a capacitive sensor or switch device and to a capacitive sensor or switch device. The present invention also relates to a production method for a micromechanical component for a capacitive sensor or switch device and to a method for producing a capacitive sensor or switch device.

BACKGROUND INFORMATION

In U.S. Patent Application Publication No. US 2014/0060169 A1, a capacitive pressure sensor is described that has a diaphragm that is mounted directly or indirectly on a substrate surface of a substrate. A through-hole is formed on the substrate that extends from a rear side of the substrate, oriented away from the substrate surface, up to a diaphragm inner side of the diaphragm, oriented to the substrate. The diaphragm is intended to be capable of being warped by a physical pressure prevailing at the rear side of the substrate that is not equal to a reference pressure present at a diaphragm outer side of the diaphragm oriented away from the substrate. The capacitive pressure sensor also includes a rocker structure having an electrode and a counterelectrode fixed on the substrate surface. A warping of the diaphragm is intended to trigger a change in the distance of the electrode from the counterelectrode, such that the physical pressure, differing from the reference pressure, at the diaphragm outer side of the diaphragm is capable of being determined on the basis of a change of a voltage between the electrode and the counterelectrode.

SUMMARY

The present invention provides a micromechanical component for a capacitive sensor or switch device, a capacitive sensor or switch device, a production method for a micromechanical component for a capacitive sensor or switch device, and a method for producing a capacitive sensor or switch device.

Example embodiments of the present invention provide micromechanical components for capacitive sensor or switch devices, or capacitive sensor or switch devices equipped therewith, in which, in contrast to the related art, the formation of a through-hole at least through the respective substrate having the diaphragm mounted on its substrate surface can be omitted. Moreover, in a micromechanical component according to an example embodiment of the present invention the diaphragm external side, oriented away from the substrate, of the self-supporting region of the respective diaphragm can be used as "sensitive diaphragm surface," so that the "sensitive diaphragm surface" of the diaphragm can easily be protected with a gel. In contrast, a filling of a through-hole required in the related art with gel is technically very difficult and costly. The present invention thus enables a low-cost production of micromechanical components, or capacitive sensor or switch devices equipped therewith, having an increased lifespan.

In an advantageous specific embodiment of the micromechanical component in accordance with the present invention, at least one second electrode is fashioned as part of a rocker structure that includes the at least one lever element and the at least one connected first electrode or is connected, independently of the rocker structure, to the diaphragm inner side of the self-supporting region of the diaphragm, in such a way that when there is a warping of the self-supporting region of the diaphragm the at least one first electrode is capable of being set into an adjustment movement, with a first movement component oriented perpendicular to the substrate surface, and the at least one second electrode is capable of being set into a second adjustment movement, with a second movement component oriented perpendicular to the substrate surface and directed opposite the first movement component. The oppositely directed movement components of the at least one first electrode and of the at least one second electrode of the specific embodiment described here of the micromechanical component facilitate an evaluation for determining the force exerted on the diaphragm outer side of the self-supporting region of the diaphragm, or of a physical variable or environmental condition corresponding to the force.

For example, the at least one lever element can be connected via, in each case, at least one first torsion spring to the diaphragm inner side of the self-supporting region of the diaphragm, and via, in each case, at least one second torsion spring to the substrate or at least one layer deposited on the substrate surface, and via, in each case, at least one third torsion spring to the first electrode assigned to it. The at least one lever element is thus easy to realize.

In particular, in each case at least two lever elements can be assigned to each first electrode in such a way that the at least two lever elements assigned to it are connected via their third torsion springs to the respective first electrode, such that all first torsion springs of the at least two lever elements assigned to the same first electrode are oriented parallel to one another with an offset, all second torsion springs of the at least two lever elements assigned to the same first electrode are oriented parallel to one another with an offset, and all third torsion springs of the at least two lever elements assigned to the same first electrode are oriented parallel to one another with an offset. In this case, a warping of the self-supporting region of the diaphragm triggers a first adjustment movement, oriented (almost) perpendicular to the substrate surface, of the at least one first electrode.

Preferably, at least the at least one lever element and the at least one first electrode are formed from a first semiconductor and/or metal layer that is situated on a side of the substrate surface oriented away from the substrate, while at least the self-supporting region of the diaphragm is formed from a second semiconductor and/or metal layer that is situated on a side of the first semiconductor and/or metal layer oriented away from the substrate. In this case, the micromechanical component is producible by a production method that is relatively easy to carry out.

Preferably, at least one first counterelectrode is also situated, directly or indirectly, on the substrate surface adjacent to the at least one first electrode and/or at least one second counterelectrode is also situated, directly or indirectly, on the substrate surface adjacent to the at least one second electrode, the at least one first counterelectrode and/or the at least one second counterelectrode being made of an electrode material layer situated between the substrate surface and the first semiconductor and/or metallic layer. In this way, an advantageous configuration of the at least one first counterelectrode and/or of the at least one second counterelectrode is also easily realizable.

In a further advantageous specific embodiment of the micromechanical component of the present invention, the at least one lever element and the at least one first electrode connected to the at least one lever element are framed by a frame structure on which the diaphragm is mounted, an interior volume enclosed by the frame structure and by the diaphragm, having a reference pressure therein, being sealed in airtight fashion such that at least the self-supporting region of the diaphragm is capable of being warped by a physical pressure on the diaphragm outer side of the self-supporting region that is not equal to the reference pressure. The specific embodiment described here of the micromechanical component can in this way advantageously be used for a capacitive pressure sensor.

The advantages described above may also be ensured in a capacitive sensor or switch device having such a micromechanical component. For example, the micromechanical component of the capacitive sensor or switch device designed as a capacitive pressure sensor device has the features described in the preceding paragraph, and includes an evaluation electronics unit that is designed to determine and to output a measurement value relating to the physical pressure prevailing in each case on the diaphragm outer side of the self-supporting region of the diaphragm, at least taking into account a currently ascertained measurement variable relating to a voltage between the at least one first electrode and the at least one first counterelectrode.

The advantages described above may also be achieved by carrying out a corresponding production method for a micromechanical component for a capacitive sensor or switch device. These advantages are also realized by carrying out a corresponding method for producing a capacitive sensor or switch device. It is here expressly noted that the methods enumerated here according to the above-explained specific embodiments of the micromechanical component and of the capacitive sensor or switch device can be further developed.

BRIEF DESCRIPTION OF THE DRAWINGS

Further features and advantages of the present invention are explained below on the basis of the Figures.

DETAILED DESCRIPTION OF EXAMPLE EMBODIMENTS

Figure 1:
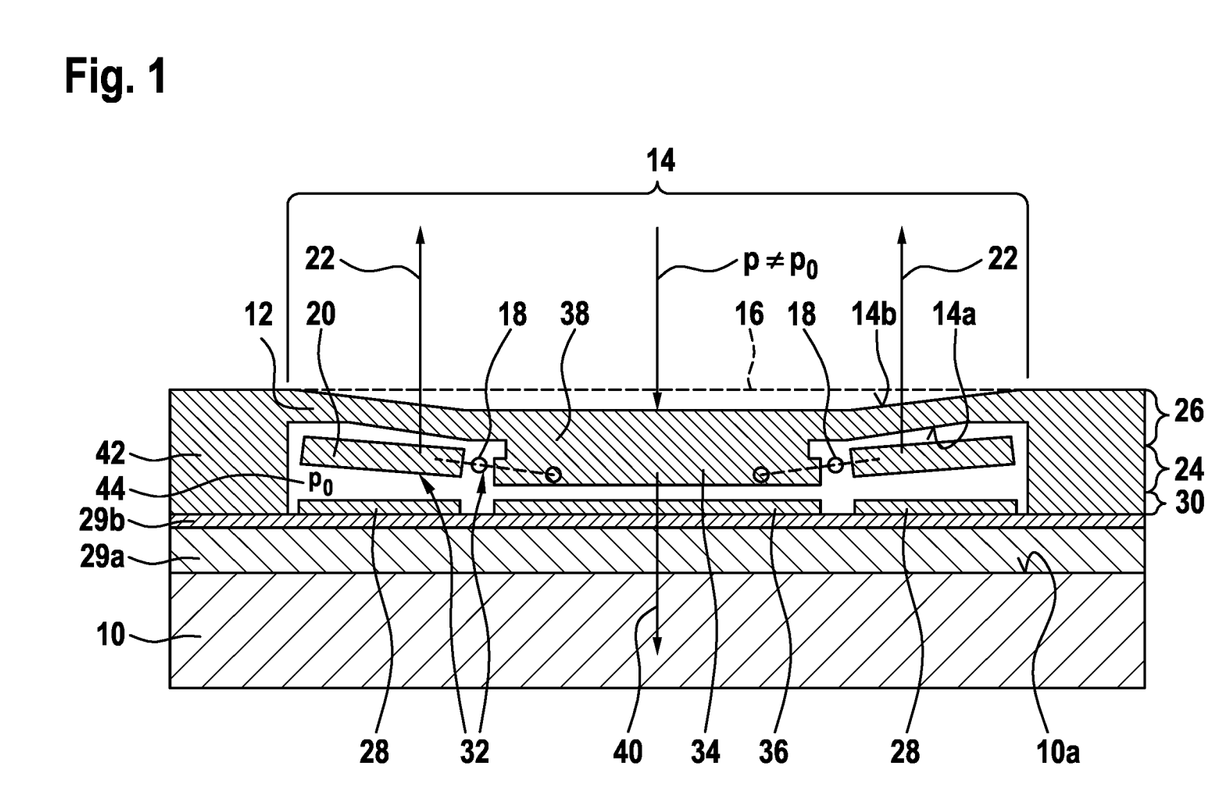
FIG. 1 shows a schematic representation of a first specific embodiment of the micromechanical component, in accordance with the present invention.

FIG. 1 shows a schematic representation of a first specific embodiment of the micromechanical component.

The micromechanical component shown schematically in FIG. 1 includes a substrate 10 having a substrate surface 10a that can be for example a semiconductor substrate, in particular a silicon substrate. However, it is to be noted that substrate 10 can also include at least one further semiconductor material, at least one metal, and/or at least one electrically insulating material, instead of or in addition to silicon.

A diaphragm 12 of the micromechanical component, mounted directly or indirectly on substrate surface 10a, has a self-supporting region 14 that has a diaphragm inner side 14a oriented toward substrate 10 and a diaphragm outer side 14b oriented away from substrate 10. As can be seen in FIG. 1, self-supporting region 14 of diaphragm 12 is capable of being warped by a force (not shown) exerted on diaphragm outer side 14b. For comparison, a dashed line 16 shows an initial shape of self-supporting region 14, present when there is an equilibrium of forces at diaphragm sides 14a and 14b.

The micromechanical component also includes at least one lever element 18 and at least one first electrode 20 connected to the at least one lever element 18. The at least one lever element 18 is in each case connected to diaphragm 12 in such a way that, when there is a warping of self-supporting region 14 of diaphragm 12, the at least one lever element 18 is set or can be set into a rotational movement. By the rotational movement of the at least one lever element 18, the at least one connected first electrode 20 is/can be into a first adjustment movement 22 oriented at an angle to substrate surface 10a. In particular, the warping of self-supporting region 14 of diaphragm 12 can be translated into a first adjustment movement 22, oriented (almost) perpendicular to substrate surface 10a, of the at least one first electrode 20. Thus, the first adjustment movement 22 of the at least one first electrode 20 does not have to be understood as a "tilting movement." Preferably, when there is a warping of diaphragm outer side 14b of self-supporting region 14 inward toward substrate 10, the at least one first electrode 20 is set into a first adjustment movement 22 oriented away from substrate 10 (see FIG. 1), while, when there is a warping of diaphragm outer side 14b of self-supporting region 14 directed away from substrate 10, the at least one first electrode 20 is set into a first adjustment movement (not shown) directed toward substrate 10.

Moreover, the at least one lever element 18 and the at least one first electrode 20 connected to the at least one lever element 18 are situated between substrate surface 10a and diaphragm inner side 14a of self-supporting region 14 of diaphragm 12. Diaphragm outer side 14b of self-supporting region 14 of diaphragm 12 can thus easily be used as a "sensitive diaphragm surface" for detection/measurement. A formation of a through-hole through at least substrate 10 in order to create a measurement access, which is required when diaphragm inner side 14a of self-supporting region 14 is used as a "sensitive diaphragm surface" as in the related art, is thus not required. In addition, diaphragm outer side 14b of self-supporting region 14 can be more easily protected, using a gel, than can diaphragm inner side 14a of self-supporting region 14. In particular, as can be seen in FIG. 1, diaphragm outer side 14b of self-supporting region 14 terminates a surface of the micromechanical component oriented away from substrate 10, which additionally facilitates an application of the gel onto diaphragm outer side 14b. The protection, improved by the facilitated application of the gel, of the "sensitive diaphragm surface" of the micromechanical component contributes to the advantageous increase in its lifespan.

A further advantage of the micromechanical component is that (at least) the at least one lever element 18 and the at least one first electrode 20 can be formed from a first semiconductor and/or metal layer 24 that is situated on a side of substrate surface 10a oriented away from substrate 10. In addition, at least the self-supporting region 14 of diaphragm 12 can be formed from a second semiconductor and/or metal layer 26 that is situated on a side of first semiconductor and/or metal layer 24 oriented away from substrate 10. In particular, the entire diaphragm 12 can be formed from second semiconductor and/or metal layer 26. The micromechanical component can therefore be produced comparatively easily and at relatively low cost.

Preferably, at least one first counterelectrode 28 is situated directly or indirectly on substrate surface 10a, adjacent to the at least one first electrode 20. The at least one first counterelectrode 28 can for example be formed on at least one layer 29a and 29b covering substrate surface 10a, such as for example at least one insulating layer 29a and 29b. The at least one first counterelectrode 28 can be formed from an electrode material layer 30 situated between substrate surface 10a and the first semiconductor and/or metal layer 24. This facilitates an equipping of the micromechanical component (at least) with the cooperating electrodes 20 and 28.

In the specific embodiment described here, the at least one lever element 18 and the at least one electrode 20 are parts of a rocker structure 32 that is connected to diaphragm inner side 14a of self-supporting region 14. When there is a warping of self-supporting region 14 of diaphragm 12, rocker structure 32 can be set/is set into a rocking movement/tilting movement in which the at least one lever element 18 carries out its rotational movement. Preferably, the overall rocker structure 32 is formed from first semiconductor and/or metal layer 24. However, it is to be noted that a formation of the at least one lever element 18 and of the at least one first electrode 20 as parts of rocker structure 32 can also be omitted.

As an advantageous development, the micromechanical component can also have at least one second electrode 34 that is fashioned as part of rocker structure 32 or is connected, independently of rocker structure 32, to diaphragm inner side 14a of self-supporting region 14 of diaphragm 12. If the micromechanical component is fashioned having the at least one second electrode 34, then at least one second counterelectrode 36 can also be situated directly or indirectly on substrate surface 10a, adjacent to the at least one second electrode 34. Preferably, the at least one second counterelectrode 36 is also formed from the electrode material layer 30. This facilitates an equipping of the micromechanical component with the interacting electrode pairs 20, 28, 34 and 36.

Only as an example, in the specific embodiment of FIG. 1 the at least one second electrode 34 is suspended on diaphragm 12 by a reinforcing structure 38 formed on diaphragm inner side 14a of self-supporting region 14. When there is a warping of self-supporting region 14 of diaphragm 12, the at least one first electrode 20 can be/is set into a first adjustment movement 22 with a first movement component oriented perpendicular to substrate surface 10a, while the at least one second electrode 34 can be/is set into a second adjustment movement 40 with a second movement component oriented perpendicular to substrate surface 10a and directed opposite to the first movement component. In this case, one can speak of a "fully differential configuration" of the at least one first electrode 20 and the at least one second electrode 34 relative to their counterelectrodes 28 and 36. The advantages of the "fully differential configuration" are explained below. First adjustment movement 22 of the at least one first electrode 20 and second adjustment movement 40 of the at least one second electrode 34 can in particular be oriented perpendicular to substrate surface 10a of the substrate and directed opposite to one another.

The micromechanical component described here can advantageously be used as part of a capacitive sensor or switch device. For example, a capacitive sensor device equipped with the micromechanical component described here can include at least one evaluation electronics unit (not shown) that is designed to determine the measurement value that indicates the force acting on diaphragm outer side 14b of self-supporting region 14, or a physical variable or environmental condition corresponding to the force, at least taking into account a currently ascertained measurement variable relating to a first voltage between the at least one first electrode 20 and the at least one first counterelectrode 28 (and possibly a currently ascertained further measurement variable relating to a second voltage between the at least one second electrode 34 and the at least one first counterelectrode 36). However, the micromechanical component can also be realized as a microphone or as a switch device. The measurement variable/variables may be understood as e.g. a potential, a current, or a charge.

In the specific embodiment of FIG. 1, rocker structure 32 is framed by a frame structure 42 on which diaphragm 12 is mounted. An inner volume 44 enclosed by frame structure 42 and diaphragm 12, having a reference pressure $p_0$ therein, is sealed in airtight fashion such that at least self-supporting region 14 of diaphragm 12 is capable of being warped by a physical pressure p on diaphragm outer side 14b of self-supporting region 14 that is not equal to reference pressure $p_0$. In this case, the evaluation electronics is designed to determine and output a measurement value relating to the physical pressure p prevailing in each case at diaphragm outer side 14b of self-supporting region 14 of diaphragm 12, at least taking into account the currently ascertain measurement value relating to the first voltage between the at least one first electrode 20 and the at least one first counterelectrode 28 (and possibly the currently ascertained further measurement variable relating to the second voltage between the at least one second electrode 34 and the at least one first counterelectrode 36).

Figure 2A:
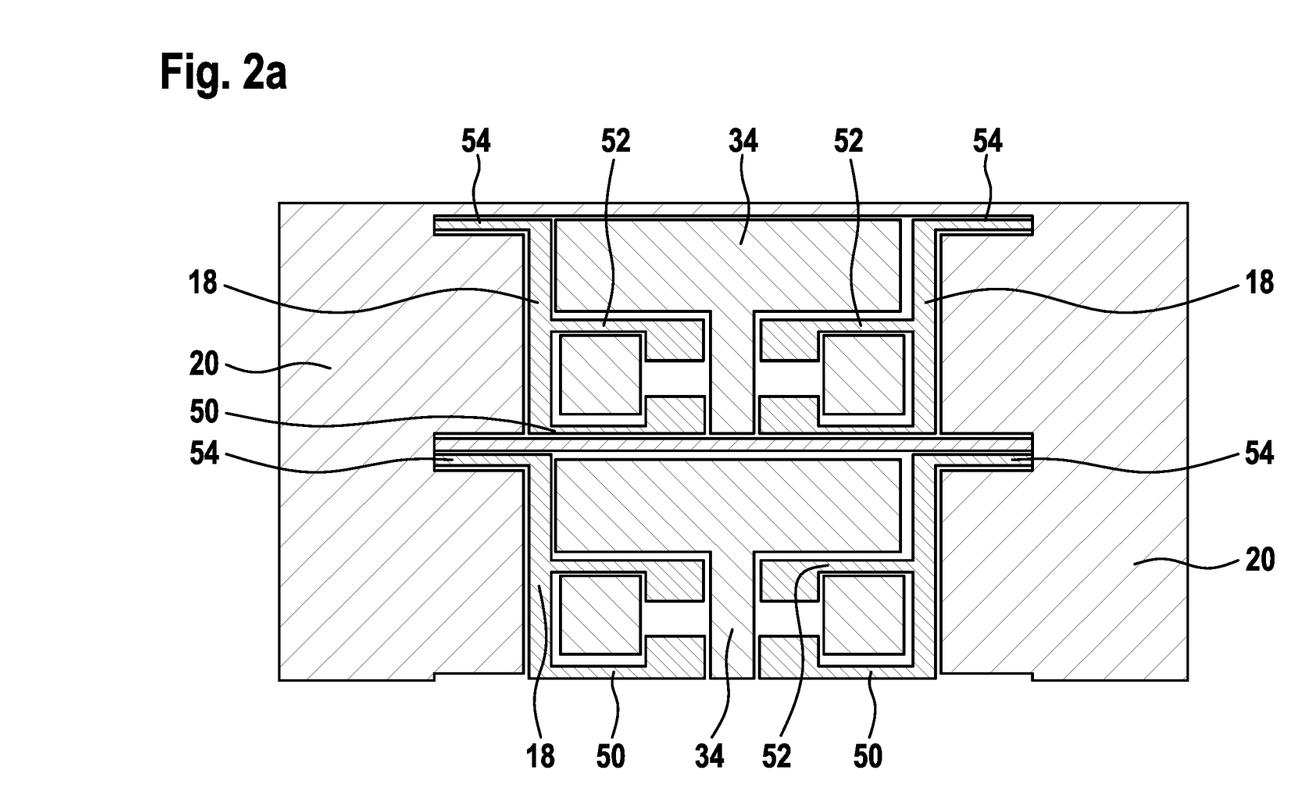
FIGS. 2a and 2b show schematic representations of a second specific embodiment of the micromechanical component, in accordance with the present invention.
Figure 2B:
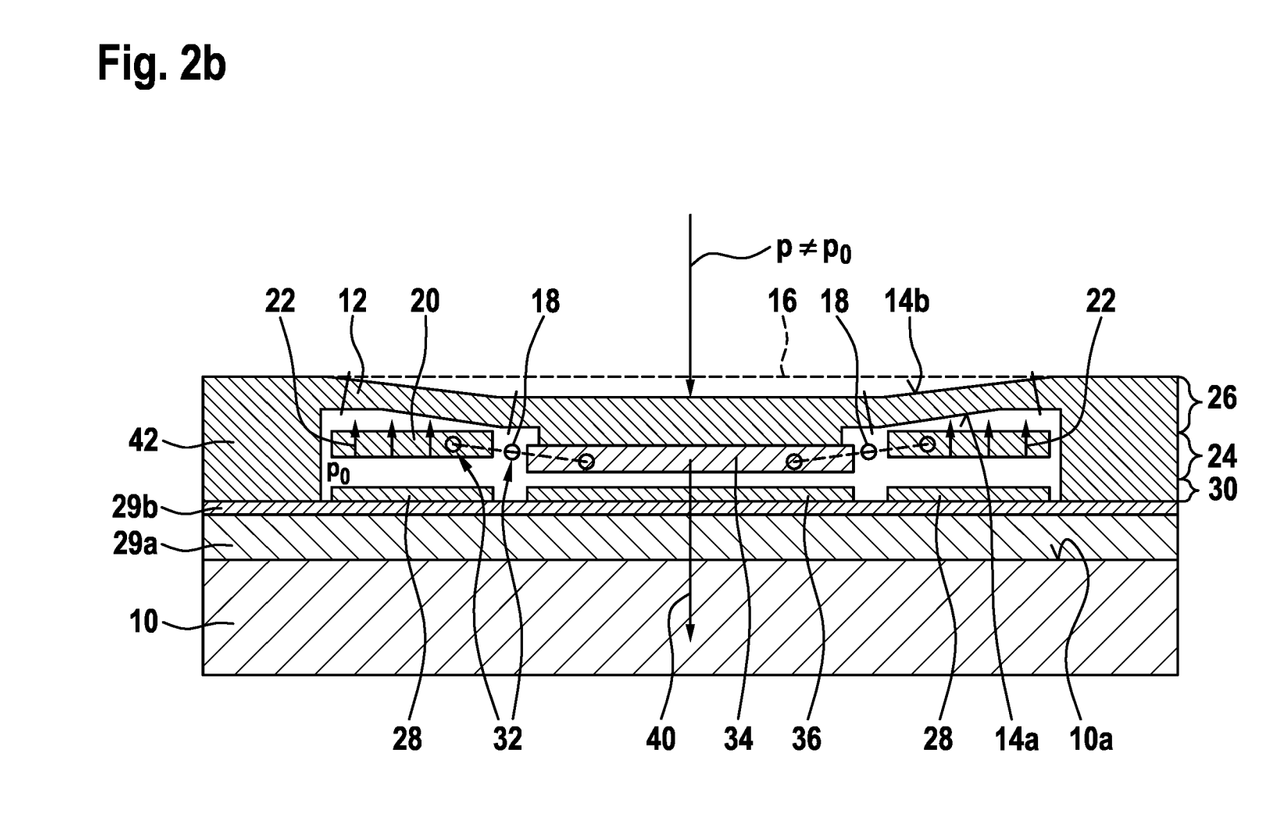

FIGS. 2a and 2b show schematic representations of a second specific embodiment of the micromechanical component.

As can be seen in FIG. 2a, the at least one lever element 18 can be connected, via in each case at least one first torsion spring 50, to diaphragm inner side 14a of self-supporting region 14 of diaphragm 12. The at least one lever element 18 also can be anchored, via in each case at least one second torsion spring 52, to substrate 10, or to at least one layer 29a and 29b deposited on substrate surface 10a. By this connection of the at least one lever element 18 both to diaphragm inner side 14a of self-supporting region 14 and also (directly or indirectly) to substrate 10, it can be brought about that a warping of self-supporting region 14 of the diaphragm triggers the desired rotational movement of the at least one lever element 18, preferably about an axis of rotation oriented parallel to substrate surface 10a of the substrate and/or perpendicularly through the respective lever element 18. Moreover, the at least one lever element 18 can be connected to first electrode 20 assigned thereto via, in each case, at least one third torsion spring 54. In this way, the rotational movement of the at least one lever element 18 is translated into the desired first adjustment movement 22 of the at least one connected first electrode 20.

Preferably, in each case at least two lever elements 18 are assigned to each first electrode 20 in such a way that the at least two lever elements 18 assigned thereto are connected to the respective first electrode 20 via their third torsion springs 54. In this case, it is advantageous if all first torsion springs 50 of the at least two lever elements 18 assigned to the same first electrode 20 are oriented parallel to one another with an offset, all second torsion springs 52 of the at least two lever elements 18 assigned to the same first electrode 20 are oriented parallel to one another with an offset, and all third torsion springs 54 of the at least two lever elements 18 assigned to the same first electrode 20 are oriented parallel to one another with an offset. In this case, a warping of self-supporting region 14 of diaphragm 12 triggers a first adjustment movement of the at least one first electrode 20 oriented (almost) perpendicular to the substrate surface. The first adjustment movement of the at least one first electrode 20 thus causes a significant first change in capacitance of a first capacitance between the at least one first electrode 20 and the at least one assigned counterelectrode 28.

With regard to further features of the micromechanical component of FIGS. 2a and 2b, reference is made to the above-explained specific embodiment.

Figure 3A:
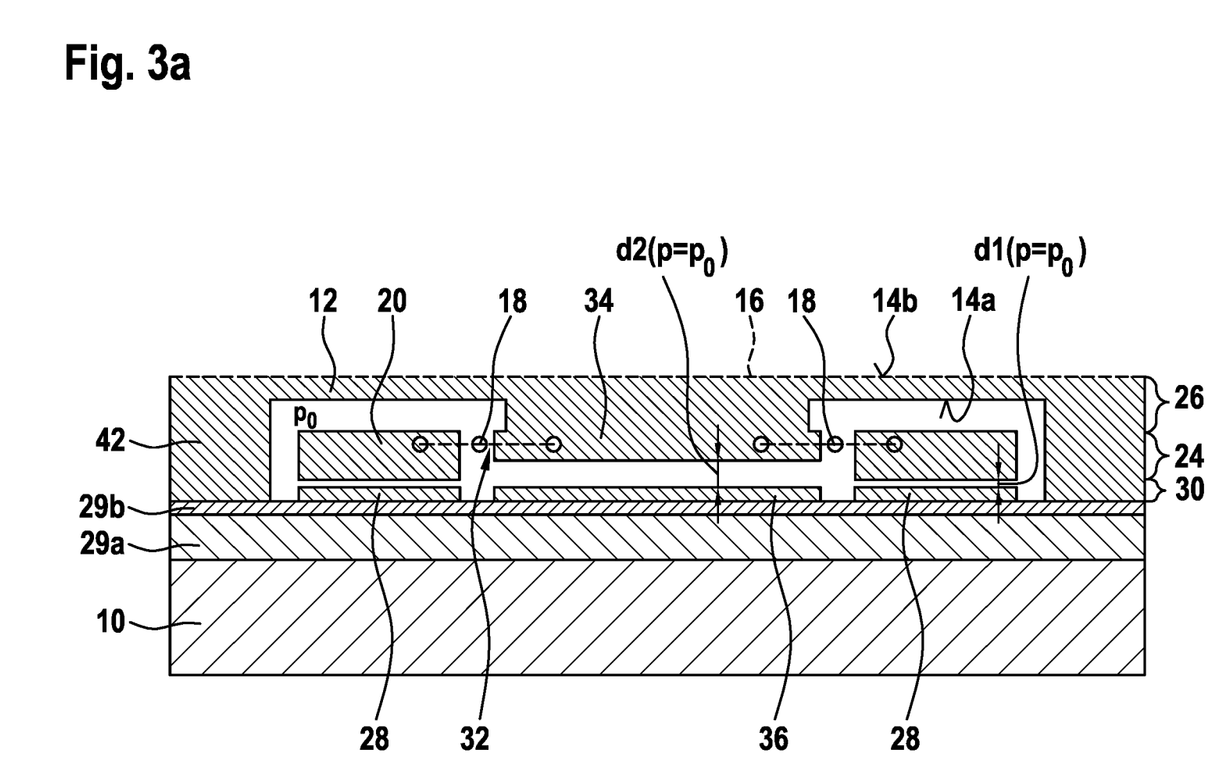
FIGS. 3a and 3b show schematic representations of a third specific embodiment of the micromechanical component, in accordance with the present invention.
Figure 3B:
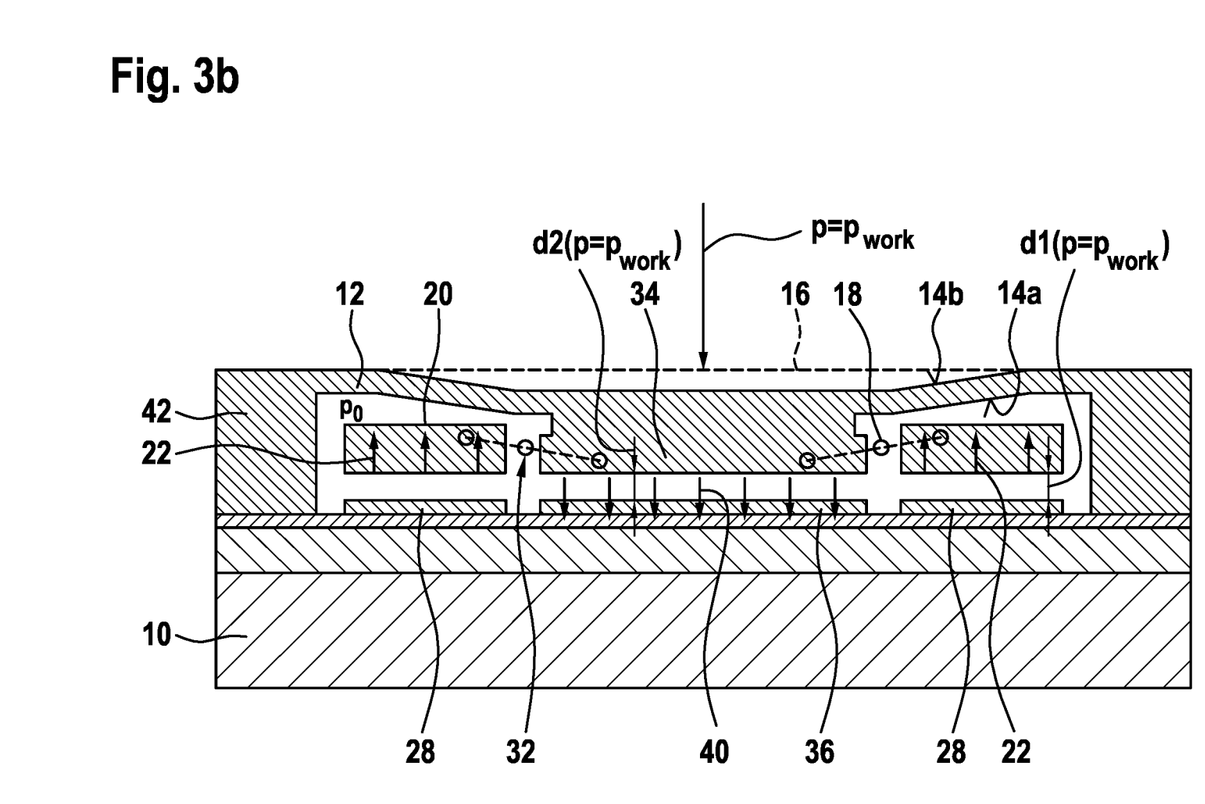

FIGS. 3a and 3b show schematic representations of a third specific embodiment of the micromechanical component.

The micromechanical component shown schematically in FIGS. 3a and 3b differs from the above-described specific embodiments in that, when there is an equilibrium of forces on diaphragm inner side 14a of self-supporting region 14 and diaphragm outer side 14b of self-supporting region 14, if self-supporting region 14 of diaphragm 12 is in its initial shape shown by dashed line 16, then the at least one first electrode 20 is at a first distance $d1(p=p_0)$ from the at least one assigned first counterelectrode 28, which is not equal to a second distance $d2(p=p_0)$ of the at least one second electrode 34 from the at least one assigned second counterelectrode 36. In particular, when there is an equilibrium of forces on diaphragm inner side 14a and diaphragm outer side 14b, the second distance $d2(p=p_0)$ between the at least one second electrode 34 and the at least one assigned second counterelectrode 36 can be greater than the first distance $d1(p=p_0)$ between the at least one first electrode 20 and the at least one assigned first counterelectrode 28 (see FIG. 3a).

A difference between the second distance $d2(p=p_0)$ and the first distance $d1(p=p_0)$ when there is an equilibrium of forces at diaphragm inner side 14a and diaphragm outer side 14b can be determined in such a way that, given a physical pressure p equal to a so-called working pressure $p_{work}$ of the micromechanical component, electrodes 20 and 34 are displaced relative to their counterelectrodes 28 and 36 in such a way that first distance $d1(p=p_{work})$ between the at least one first electrode and the at least one assigned first counterelectrode 28 is (almost) equal to second distance $d2(p=p_{work})$ between the at least one second electrode 34 and the at least one assigned second counterelectrode 36 (see FIG. 3b). The working pressure $p_{work}$ can be understood as an (average) pressure that prevails, normally or averaged over time, at diaphragm outer side 14b during operation of the micromechanical component.

A determination of the difference between second distance $d2(p=p_0)$ and first distance $d1(p=p_0)$, as described in the preceding paragraph, has the result that, given a physical pressure p that deviates (slightly) from working pressure $p_{work}$ at diaphragm outer side 14b, both a first change in capacitance of a first capacitance between the at least one first electrode 20 and the at least one assigned first counterelectrode 28 and also a second change of capacitance of a second capacitance between at least the at least one second electrode 34 and the at least one assigned second counterelectrode 36 are each an (almost) linear signal, as a function of a deviation of physical pressure p from working pressure $p_{work}$. Moreover, in this case a bending of substrate 10 frequently causes a first change in capacitance of the first capacitance, whose magnitude is (almost) equal to a magnitude of a second change in capacitance of the second capacitance, the changes in capacitance having different signs. Through a difference formation, the changes in capacitance resulting in the first capacitance and the second capacitance from the bending of substrate 10 can thus easily be "filtered out."

With regard to further features of the micromechanical component of FIGS. 3a and 3b, reference is made to the specific embodiments explained above.

Figure 4A:
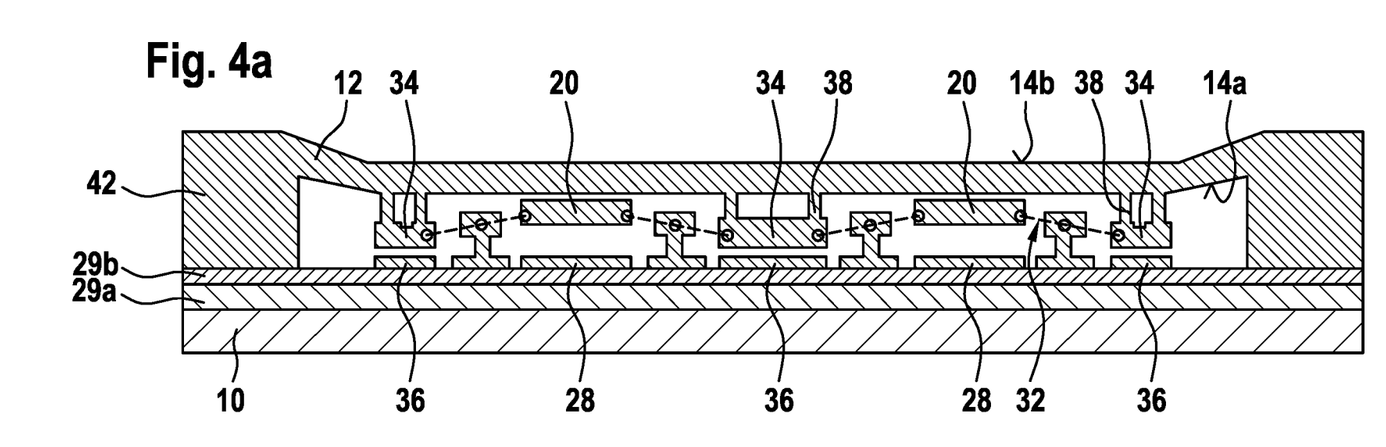
FIGS. 4a and 4b show schematic representations of a fourth specific embodiment of the micromechanical component, in accordance with the present invention.
Figure 4B:
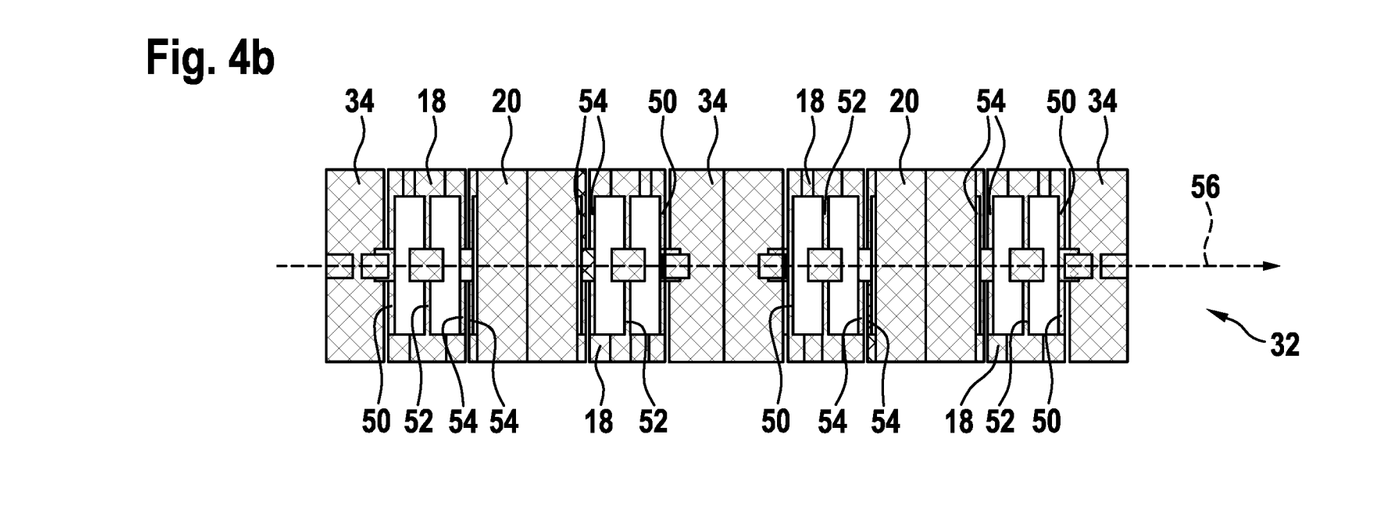

FIGS. 4a and 4b show schematic representations of a fourth specific embodiment of the micromechanical component.

As can be seen on the basis of the micromechanical component shown schematically in FIGS. 4a and 4b, the at least one first electrode 20, the at least one second electrode 34, the at least one first counterelectrode 28, and the at least one second counterelectrode 36 can also be divided into a plurality of sub-electrode regions spatially separate from one another. Moreover, diaphragm 12, or its self-supporting region 14, can be realized as an "oblong diaphragm." Along a longitudinal direction 56 of diaphragm 12, first electrodes 20 and second electrodes 34 can alternate among one another in such a way that, respectively, a second electrode 34 is situated between two adjacent first electrodes 20, and a first electrode 20 is situated between two adjacent second electrodes 34 (see FIG. 4b). Correspondingly, along longitudinal direction 56 of diaphragm 12, first counterelectrodes 28 and second counterelectrodes 36 can also alternate among one another in such a way that, respectively, a second counterelectrode 36 is situated between two adjacent first counterelectrodes 28, and a first counterelectrode 28 is situated between two adjacent second counterelectrode 36. In particular, a complete symmetry of the micromechanical component is possible relative to a plane of symmetry in which longitudinal direction 56 of diaphragm 12 lies. In this way, it can be achieved that a bending of substrate 10 frequently triggers a first change in capacitance of the first capacitance whose magnitude is (almost) equal to a magnitude of a likewise triggered second change of capacitance of the second capacitance, the changes of capacitance having different signs.

With regard to further features of the micromechanical component of FIGS. 4a and 4b, reference is made to the specific embodiments explained above.

In all the micromechanical components described above, there is a "fully differential configuration" of the at least one first electrode 20 and the at least one second electrode 34 relative to their counterelectrodes 28 and 36. The determination of a measurement value that indicates the force acting on the diaphragm outer side 14b of self-supporting region 14, or a physical variable or environmental condition corresponding to the force, can therefore be done through a difference formation of the first capacitance and the second capacitance. A signal obtained from this difference formation is greater by a factor of 2 than is a comparative signal obtained only from the first change of capacitance of the first capacitance or only from the second change of capacitance of the second capacitance. The "fully differential configuration" of electrodes 20 and 34 can therefore be used for the miniaturization of the micromechanical component, while maintaining its sensitivity and/or its measurement accuracy. Correspondingly, the "fully differential configuration" can also be used to increase the sensitivity and/or the measurement accuracy of the micromechanical component while maintaining its constructive size. For the evaluation of the micromechanical component described here, an evaluation electronics unit can therefore be used that is simple, requires little constructive space, and is low in cost.

A further advantage of the "fully differential configuration" and the difference formation of the first capacitance and the second capacitance is that a temperature offset is automatically "filtered out." Moreover, the "fully differential configuration" and the difference formation contribute, as described above, to the "filtering out" of measurement errors that are due to a bending of substrate 10.

Figure 5:
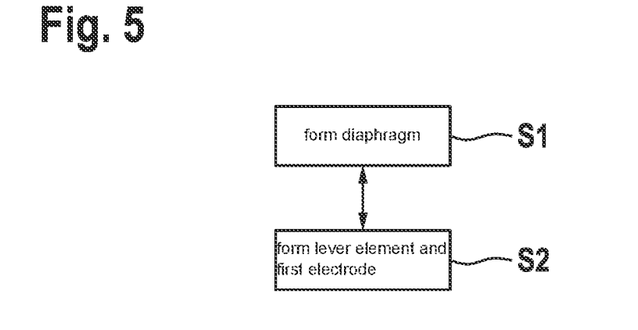
FIG. 5 shows a flow diagram explaining a first specific embodiment of the production method, in accordance with the present invention.

FIG. 5 shows a flow diagram explaining a first specific embodiment of the production method.

Using the production method described here, a micromechanical component for a capacitive sensor or switch device can be produced. In a method step S1 of the production method, a diaphragm mounted directly or indirectly on a substrate surface of a substrate, and having a self-supporting region that has a diaphragm inner side oriented toward the substrate and a diaphragm outer side oriented away from the substrate, is formed in such a way that the self-supporting region of the diaphragm is capable of being warped by a force exerted on the diaphragm outer side.

In a method step S2, at least one lever element and at least one first electrode connected to the at least one lever element are formed, the at least one lever element being connected to the diaphragm in such a way that when there is a warping of the self-supporting region of the diaphragm, the at least one lever element is set into a rotational movement, whereby the at least one connected first electrode is set into a first adjustment movement oriented at an angle to the substrate surface. Moreover, the at least one lever element and the at least one connected first electrode are situated between the substrate surface and the diaphragm inner side of the self-supporting region of the diaphragm.

Method steps S1 and S2 can be carried out in any sequence, or temporally overlapping. Preferably, at least the at least one first lever element and the at least one first electrode are formed from a first semiconductor and/or metal layer that is situated on a side of the substrate surface oriented away from the substrate. In addition, at least the self-supporting region of the diaphragm can be formed from a second semiconductor and/or metal layer that is situated on a side of the first semiconductor and/or metal layer oriented away from the substrate.

Figure 6:
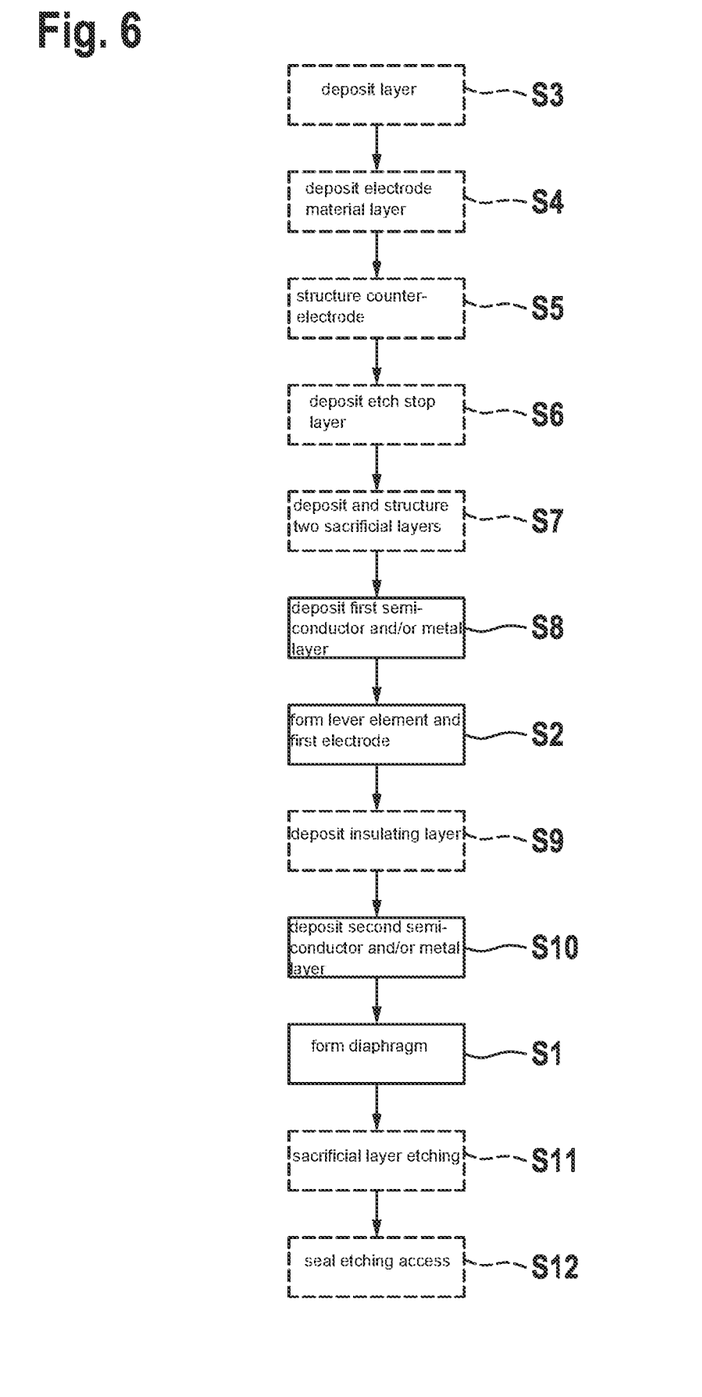
FIG. 6 shows a flow diagram explaining a second specific embodiment of the production method, in accordance with the present invention.

FIG. 6 shows a flow diagram explaining a second specific embodiment of the production method.

The production method described below is a development of the method explained above:

In the specific embodiment described here of the production method, first, in an (optional) method step S3, at least one layer, such as at least one insulating layer, is deposited on a substrate surface of a substrate. Optionally, the at least one layer/insulating layer can also be structured, for example in order to form a contact for at least one electrode component, formed later, of the micromechanical component on the substrate.

In an (optional) method step S4, an electrode material layer is deposited on the substrate surface or on the at least one layer situated on the substrate surface. For example, a doped polysilicon layer can be deposited as the electrode material layer. In a further (optional) method step S5, at least one counterelectrode is then structured out from the electrode material layer. Optionally, at least one printed conductor can also be formed from the electrode material layer in addition to the at least one counterelectrode.

As an (optional) method step S6, an etch stop layer, preferably an electrically insulating etch stop layer, can subsequently be deposited. For example, a (silicon-rich) nitride layer can be formed as etch stop layer.

In a subsequent (optional) method step S2, a sacrificial layer, preferably an oxide layer, is deposited. By structuring the sacrificial layer, a shape of the at least one lever element and of the at least one first electrode connected to the at least one lever element, which are formed later in method step S2, can optionally be determined. Optionally, in method step S7 two sacrificial layers can also be deposited and structured, whereby the above-described different distances $d1(p=p_0)$ and $d2(p=p_0)$ between the electrode structures formed by the production method described here can also be set.

Subsequently, the first semiconductor and/or metal layer is deposited, in a method step S8. Preferably, a polysilicon layer is deposited as first semiconductor and/or metal layer. Preferably, the first semiconductor and/or metal layer is formed having a first layer thickness of at least 500 nm. Subsequently, the method step S2 described above is carried out, whereby at least the at least one lever element and the at least one first electrode are formed from the first semiconductor and/or metal layer. For the structuring of the first semiconductor and/or metal layer, an etching method is preferably carried out that results in perpendicular etched trenches, such as a trench method. In the etching of the first semiconductor and/or metal layer, preferably very narrow trenches are etched having an etching width that is less than the first layer thickness of the first semiconductor and/or metal layer. This facilitates further layer depositions on the structured first semiconductor and/or metal layer.

In a further (optional) method step S9, an insulating layer, preferably an oxide layer, is deposited. An insulating layer thickness of the insulating layer can be selected to be greater than half the first layer thickness of the first semiconductor and/or metal layer, in order to fill the narrow etched trenches formed in method step S2, in which hollow spaces may be enclosed. Through a structuring of the insulating layer, a shape of the diaphragm and/or of at least one component "suspended" on the diaphragm inner side of the diaphragm, which are formed later in method step S1, can optionally be determined. Moreover, in the insulating layer narrow "slits" can be produced through which, by an isotropic etching, parts of the sacrificial layer under the first semiconductor and/or metal layer are etched out. In this way, at least one hollow space can be formed in the sacrificial layer, which brings about an intended spreading of an etching medium during a later sacrificial layer etching. The "slits" can subsequently be sealed with a further oxide deposition.

The second semiconductor and/or metal layer is now deposited as method step S10. As second semiconductor and/or metal layer, preferably a polysilicon layer is formed. A second layer thickness of the second semiconductor and/or metal layer is preferably approximately 55% to 75% of the first layer thickness of the first semiconductor and/or metal layer. Subsequently, the method step S1, described above, is carried out. Optionally, at least one etching access is also structured for the subsequent carrying out of the sacrificial layer etching through the second semiconductor and/or metal layer.

As (optional) method step S11, the sacrificial layer etching mentioned above is then carried out, the sacrificial layer being preferably completely removed by the sacrificial layer etching. In this way, the components formed in method step S2 from the first semiconductor and/or metal layer are exposed. As sacrificial layer etching, for example a gas phase etching method using hydrogen fluoride (HF) can be carried out.

The at least one etching access used to carry out the sacrificial layer etching can subsequently be sealed in an (optional) method step S12. In this way, a defined reference pressure can be set as internal pressure in the micromechanical component. The sealing of the at least one etching access can take place by a chemical gas phase deposition at low pressure (low pressure chemical vapor deposition, LPCVD) or by a plasma-supported chemical gas phase deposition (plasma-enhanced chemical vapor deposition, PECVD). Here, for example an oxide layer and/or a (silicon-rich) nitride layer can be deposited.

It is to be noted that the above-described method steps S1 through S12 of the production method are not to be interpreted as conclusive.

The production method explained above can also be part of a method for producing a capacitive sensor or switch device.

What is claimed is:

1. A micromechanical component for a capacitive sensor or switch device, comprising:
    a substrate having a substrate surface;
    a diaphragm mounted directly or indirectly on the substrate surface, the diaphragm having a self-supporting region that has a diaphragm inner side oriented toward the substrate and a diaphragm outer side oriented away from the substrate, the self-supporting region of the diaphragm being configured to be warped by a force exerted on the diaphragm outer side; and
    at least one lever element and at least one first electrode connected to the at least one lever element, the at least one lever element being connected to the diaphragm in such a way that when there is a warping of the self-supporting region of the diaphragm, the at least one lever element is capable of being set into a rotational movement, whereby the at least one connected first electrode is capable of being set into a first adjustment movement oriented at an angle to the substrate surface;
    wherein the at least one lever element and the at least one first electrode connected to the at least one lever element are situated between the substrate surface and the diaphragm inner side of the self-supporting region of the diaphragm.

2. The micromechanical component as recited in claim 1, wherein at least one second electrode is fashioned as part of a rocker structure including the at least one lever element and the at least one connected first electrode, or is connected, independently of the rocker structure, to the diaphragm inner side of the self-supporting region of the diaphragm, in such a way that when there is a warping of the self-supporting region of the diaphragm, the at least one first electrode is capable of being set into a first adjustment movement having a first movement component oriented perpendicular to the substrate surface, and the at least one second electrode is capable of being set into a second adjustment movement having a second movement component that is oriented perpendicular to the substrate surface and is directed opposite the first movement component.

3. The micromechanical component as recited in claim 1, wherein the at least one lever element is connected via, in each case, at least one first torsion spring to the diaphragm inner side of the self-supporting region of the diaphragm, and via, in each case, at least one second torsion spring to the substrate or at least one layer deposited on the substrate surface, and via, in each case, at least one third torsion spring to the first electrode assigned to it.

4. The micromechanical component as recited in claim 3, wherein each respective first electrode of the at least one first electrode have assigned to it, in each case, at least two lever elements, in such a way that the at least two lever elements assigned to it are connected to the respective first electrode via their third torsion springs, and all first torsion springs of the at least two lever elements assigned to the same first electrode being oriented parallel to one another with an offset, all second torsion springs of the at least two lever elements assigned to the same first electrode being oriented parallel to one another with an offset, and all third torsion springs of the at least two lever elements assigned to the same first electrode being oriented parallel to one another with an offset.

5. The micromechanical component as recited in claim 1, wherein the at least one first lever element and the at least one first electrode are formed from a first semiconductor and/or metal layer that is situated on a side of the substrate surface oriented away from the substrate, and at least the self-supporting region of the diaphragm is formed from a second semiconductor and/or metal layer that is situated on a side of the first semiconductor and/or metal layer oriented away from the substrate.

6. The micromechanical component as recited in claim 2, wherein:
    at least one first counterelectrode is situated directly or indirectly on the substrate surface adjacent to the at least one first electrode;
    at least one second counterelectrode is situated directly or indirectly on the substrate surface adjacent to the at least one second electrode;
    the at least one first counterelectrode and/or the at least one second counterelectrode are formed from an electrode material layer situated between the substrate surface and a layer forming the at least one first lever element, the at least one first electrode, and the at least one second electrode.

7. The micromechanical component as recited in claim 1, wherein the at least one lever element and the at least one first electrode connected to the at least one lever element are framed by a frame structure on which the diaphragm is mounted, an internal volume enclosed by the frame structure and the diaphragm, with a reference pressure in the internal volume, being sealed in airtight fashion in such a way that at least the self-supporting region of the diaphragm is capable of being warped by a physical pressure on the diaphragm outer side of the self-supporting region not equal to the reference pressure.

8. A capacitive sensor or switch device, comprising:
    a micromechanical component, including:
        a substrate having a substrate surface;
        a diaphragm mounted directly or indirectly on the substrate surface, the diaphragm having a self-supporting region that has a diaphragm inner side oriented toward the substrate and a diaphragm outer side oriented away from the substrate, the self-supporting region of the diaphragm being configured to be warped by a force exerted on the diaphragm outer side; and
        at least one lever element and at least one first electrode connected to the at least one lever element, the at least one lever element being connected to the diaphragm in such a way that when there is a warping of the self-supporting region of the diaphragm, the at least one lever element is capable of being set into a rotational movement, whereby the at least one connected first electrode is capable of being set into a first adjustment movement oriented at an angle to the substrate surface;

wherein the at least one lever element and the at least one first electrode connected to the at least one lever element are situated between the substrate surface and the diaphragm inner side of the self-supporting region of the diaphragm.

9. The capacitive sensor or switch device as recited in claim 8, wherein at least one first counterelectrode is situated directly or indirectly on the substrate surface adjacent to the at least one first electrode, wherein the micromechanical component of the capacitive sensor or switch device is a capacitive pressure sensor device in which the at least one lever element and the at least one first electrode connected to the at least one lever element are framed by a frame structure on which the diaphragm is mounted, an internal volume enclosed by the frame structure and the diaphragm, with a reference pressure in the internal volume, being sealed in airtight fashion in such a way that at least the self-supporting region of the diaphragm is capable of being warped by a physical pressure on the diaphragm outer side of the self-supporting region not equal to the reference pressure, and including an evaluation electronics that is configured to determine and to output a measurement value relating to the physical pressure prevailing in each case at the diaphragm outer side of the self-supporting region of the diaphragm, at least taking into account a currently ascertained measurement variable relating to a voltage between the at least one first electrode and the at least one first counterelectrode.

10. The micromechanical component as recited in claim 1, wherein at least one first counterelectrode (a) is situated directly or indirectly on the substrate surface adjacent to the at least one first electrode and (b) is formed from an electrode material layer situated between the substrate surface and a layer forming the at least one first lever element and the at least one first electrode.

11. The micromechanical component as recited in claim 2, wherein at least one first counterelectrode (a) is situated directly or indirectly on the substrate surface adjacent to the at least one first electrode and (b) is formed from an electrode material layer situated between the substrate surface and a layer forming the at least one first lever element and the at least one first electrode.

12. The micromechanical component as recited in claim 2, wherein at least one counterelectrode (a) is situated directly or indirectly on the substrate surface adjacent to the at least one second electrode and (b) is formed from an electrode material layer situated between the substrate surface and a layer forming the at least one first lever element and the at least one second electrode.

13. The micromechanical component as recited in claim 1, wherein the diaphragm is arranged to extend in parallel to the substrate surface when the diaphragm is in an equilibrium state, and the warping of the diaphragm by the force exerted on the diaphragm outer side shifts at least a portion of the diaphragm from being parallel to the substrate surface to be non-parallel to the substrate surface.

14. A production method for a micromechanical component for a capacitive sensor or switch device, comprising the following steps:

forming a diaphragm, mounted directly or indirectly on a substrate surface of the substrate, having a self-supporting region that has a diaphragm inner side oriented toward the substrate and a diaphragm outer side oriented away from the substrate, such that the self-supporting region of the diaphragm is capable of being warped by a force exerted on the diaphragm outer side; and forming at least one lever element and at least one first electrode connected to the at least one lever element, the at least one lever element being connected to the diaphragm in such a way that, when there is a warping of the self-supporting region of the diaphragm, the at least one lever element is set into a rotational movement, whereby the at least one connected first electrode is set into a first adjustment movement oriented at an angle to the substrate surface;

wherein the at least one lever element and the at least one first electrode connected to the at least one lever element are situated between the substrate surface and the diaphragm inner side of the self-supporting region of the diaphragm.

15. The production method as recited in claim 14, wherein at least the at least one lever element and the at least one first electrode are formed from a first semiconductor and/or metal layer that is situated on a side of the substrate surface oriented away from the substrate, and at least the self-supporting region of the diaphragm is formed from a second semiconductor and/or metal layer that is situated on a side of the first semiconductor and/or metal layer oriented away from the substrate.

16. A method for producing a capacitive sensor or switch device, comprising:

producing a micromechanical component including:
forming a diaphragm, mounted directly or indirectly on a substrate surface of the substrate, having a self-supporting region that has a diaphragm inner side oriented toward the substrate and a diaphragm outer side oriented away from the substrate, such that the self-supporting region of the diaphragm is capable of being warped by a force exerted on the diaphragm outer side; and forming at least one lever element and at least one first electrode connected to the at least one lever element, the at least one lever element being connected to the diaphragm in such a way that, when there is a warping of the self-supporting region of the diaphragm, the at least one lever element is set into a rotational movement, whereby the at least one connected first electrode is set into a first adjustment movement oriented at an angle to the substrate surface;

wherein the at least one lever element and the at least one first electrode connected to the at least one lever element are situated between the substrate surface and the diaphragm inner side of the self-supporting region of the diaphragm.

* * * * *